United States Patent
Rijssemus

(10) Patent No.: US 7,746,194 B2
(45) Date of Patent: Jun. 29, 2010

(54) SIGNAL SPLITTER/COMBINER FOR REDUCING NOISE INGRESS AND CABLE TELEVISION NETWORK INCORPORATING PLURALITY OF SAME

(75) Inventor: Martien Rijssemus, Heelsun (NL)

(73) Assignee: Technetix Group Limited (GB)

( * ) Notice: Subject to any disclaimer, the term of this patent is extended or adjusted under 35 U.S.C. 154(b) by 523 days.

(21) Appl. No.: 11/204,608

(22) Filed: Aug. 16, 2005

(65) Prior Publication Data

US 2007/0035361 A1     Feb. 15, 2007

(30) Foreign Application Priority Data

Aug. 12, 2005     (GB)     ................... 0516561.8

(51) Int. Cl.
*H03H 7/38*     (2006.01)
(52) U.S. Cl. .............. 333/124; 333/126; 333/129; 333/132
(58) Field of Classification Search ................ 333/124, 333/126, 129, 132, 24 R; 386/22, 28, 41, 386/114, 115
See application file for complete search history.

(56) References Cited

U.S. PATENT DOCUMENTS

| | | | | |
|---|---|---|---|---|
| 3,769,610 A | * | 10/1973 | Savarin et al. | 333/111 |
| 3,895,321 A | * | 7/1975 | Seidel | 333/109 |
| 3,974,465 A | * | 8/1976 | White | 333/164 |
| 4,302,733 A | * | 11/1981 | Salzberg | 333/101 |
| 4,323,863 A | * | 4/1982 | Weber | 333/109 |
| 5,083,094 A | * | 1/1992 | Forsberg | 330/124 R |
| 5,130,664 A | | 7/1992 | Pavlic | |
| 5,178,728 A | | 1/1993 | Boysel et al. | |
| 5,258,722 A | * | 11/1993 | Jeffers | 330/149 |
| 5,828,273 A | * | 10/1998 | Harrison | 333/127 |
| 5,898,454 A | | 4/1999 | Brickell | |
| 6,049,693 A | | 4/2000 | Baran | |
| 6,310,788 B1 | * | 10/2001 | Myer | 363/39 |
| 6,538,528 B2 | * | 3/2003 | Louzir et al. | 333/128 |
| 6,578,202 B1 | | 6/2003 | Holland | |
| 6,806,790 B2 | * | 10/2004 | Ji | 333/119 |
| 6,922,169 B2 | * | 7/2005 | Moh'd Izzat et al. | 342/360 |
| 2003/0042992 A1 | * | 3/2003 | Frank | 333/26 |

* cited by examiner

*Primary Examiner*—Robert J. Pascal
*Assistant Examiner*—Kimberly E Glenn
(74) *Attorney, Agent, or Firm*—Barnes & Thornburg LLP

(57) ABSTRACT

A signal splitter comprising an input and a plurality of outputs is provided, wherein alternate outputs are connected to phase shifting devices. The phase shifting devices preferably comprise phase shifting transformers and introduce a phase shift of 180°, so that noise components of alternate outputs are antiphase and cancel one another out almost entirely when the signals are summed. Also provided is a cable television network comprising a plurality of such signal splitters to ensure that noise ingress in upstream signals passing into the network is substantially reduced.

6 Claims, 3 Drawing Sheets

SIGNAL SPLITTER/COMBINER FOR REDUCING NOISE INGRESS AND CABLE TELEVISION NETWORK INCORPORATING PLURALITY OF SAME

FIELD OF THE INVENTION

This invention relates to a signal splitter/combiner for reducing noise ingress and a cable television network incorporating such splitters/combiners.

BACKGROUND TO THE INVENTION

Cable television networks are no longer purely distribution networks used for TV and radio distribution, but now also provide access for the customer to the networks. Thus TV and radio signals are distributed from a local centre or optical node by way of a signal splitter/combiner with an output connected to each customer. Return traffic from each customer is returned through the splitter/combiner to the local centre or optical node and thence to the rest of the network. Such return traffic might include requests for pay-per-view television programmes.

Usually the traffic from the customer to the local centre or optical node is called "return path traffic" or "upstream signals". The upstream signals are transported using a different frequency range than the distribution signals (usually called "downstream signals") originating from the network provider. Modern cable TV networks typically use 5 MHz to 65 MHz for upstream signals and 85 MHz to 862 MHz for downstream signals, although other frequency ranges are also used.

All upstream signals, no matter how they originate, are transported to the local centre or optical node. Thus unwanted noise in upstream signals will also be injected into the network. The unwanted signals originate from various sources but a major part is due to radiation of outside transmitters in the used upstream frequency range. The total sum of these unwanted signals is known as "ingress". The majority of ingress originates from the in-house installation of the customer and is therefore injected into the network at a customer access point. This ingress is a major problem in the network since all these unwanted signals are summed and will limit the signal to noise ratio (and therefore the capacity) of the upstream signals.

It is an aim of the present invention to provide a signal splitter/combiner which reduces noise ingress into a cable television distribution network.

SUMMARY OF THE INVENTION

In accordance with the present invention, there is provided a signal splitter/combiner comprising an input and a plurality of outputs, wherein alternate outputs are connected to phase shifting devices. Where such a signal splitter/combiner is used in a cable television network, the phase shifting devices ensure that noise ingress in upstream signals, i.e. those originating from the customer, passing into the network is substantially reduced. The upstream signals are made up of signals from a number of different customers, each customer signal including data and noise components. The data components from different customers are unrelated in amplitude, phase, and frequency as they originate from different subscriber equipment. However the noise components in each customer signal are similar to one another because they originate for the most part from the same source, namely radio frequency electromagnetic radiation picked up by the equipment of the subscribers and the cables connecting such equipment to the outputs of the splitter/combiner. Introduction of a phase shift into the upstream signal before it reaches an output ensures that the noise components cancel one another when the upstream signals originating from the customers are by the splitter/combiner.

Preferably the phase shifting devices introduce a phase shift of 180°, so that noise components of alternate outputs are antiphase and cancel one another out almost entirely when the signals are combined.

Each phase shifting device may comprise a phase shifting transformer.

Where the splitter/combiner has an even number N of outputs, N/2 phase shifting devices will be required, N/2 being a whole number. Where the splitter/combiner has an odd number X of outputs, then the number of phase shifting devices used will be the nearest whole number above or below X/2.

If required the phase shifting devices may be permanently connected to their respective outputs and secured within a common housing to the outputs, so being built into the splitter/combiner. Alternatively the phase shifting devices may be separable from their respective outputs.

In accordance with another aspect of the invention, there is provided a cable television network incorporating a plurality of signal splitters/combiners comprising an input and a plurality of outputs, wherein alternate outputs are connected to phase shifting devices, the phase shifting devices acting in use to ensure that noise ingress in upstream signals, i.e. those originating from the customer, passing into the network is substantially reduced.

BRIEF DESCRIPTION OF THE DRAWING FIGURES

The invention will now be described by way illustrative example and with reference to the attached drawing figures, in which.

Figure 4:
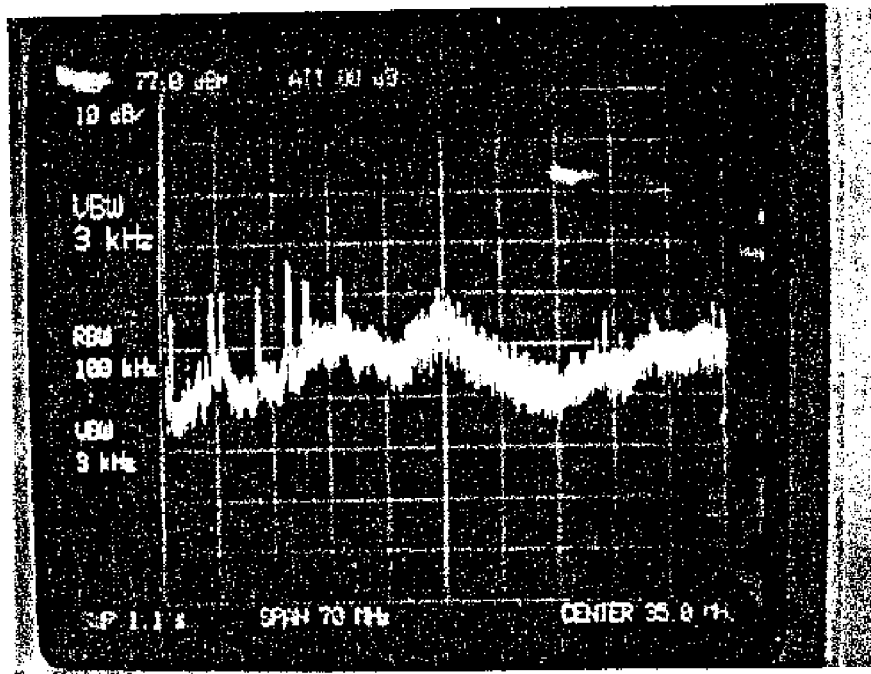
Figure 5:
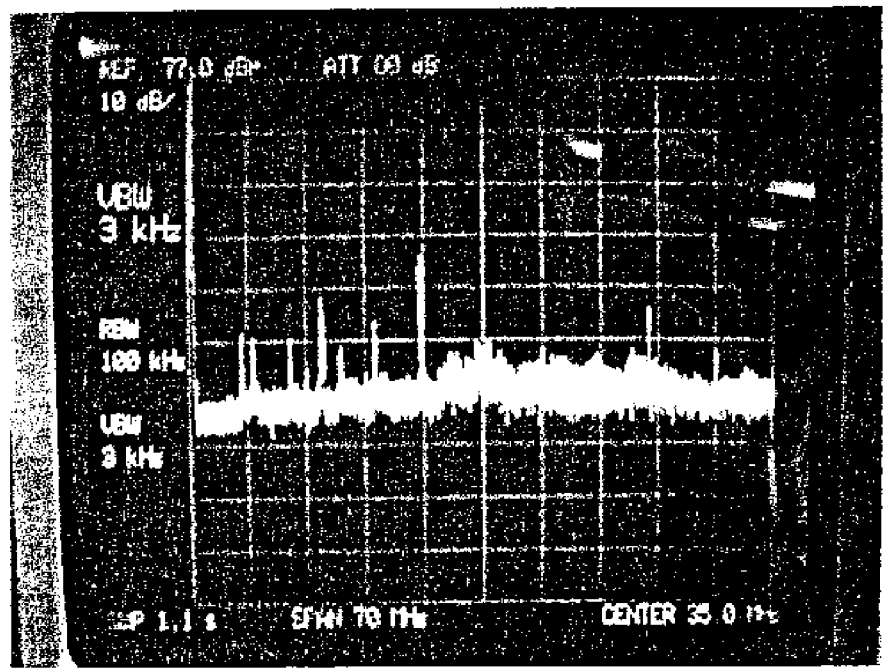
Figure 6:
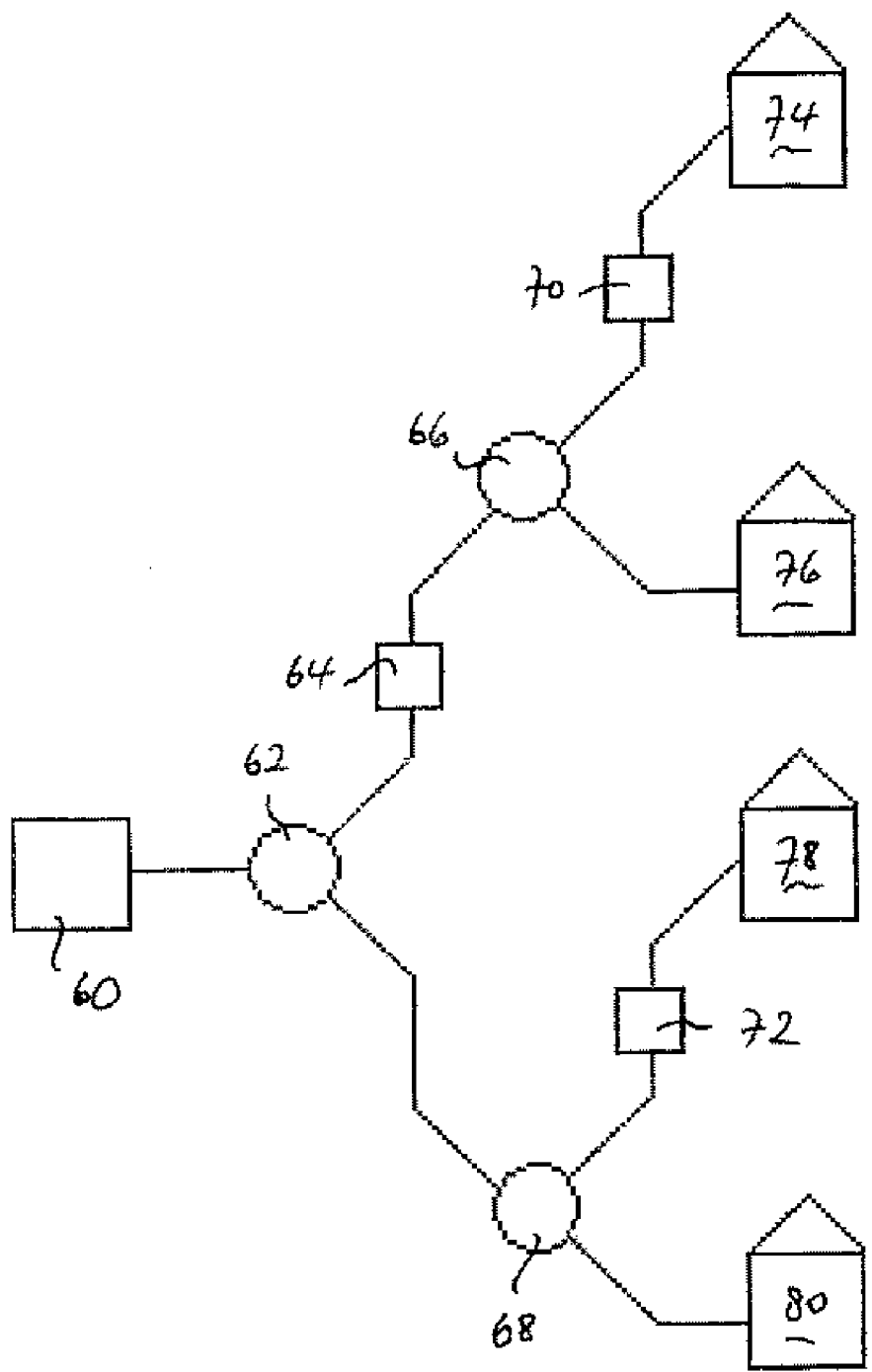

FIGS. 4 and 5 are spectrum analyser traces showing the powers of the combined signals at the inputs, respectively, of a prior art signal splitter/combiner and a signal splitter/combiner according to the invention, when used in a cable television network; and FIG. 6 is a schematic diagram of a cable television network incorporating a plurality of signal splitters/combiners in accordance with the invention.

DESCRIPTION

Figure 1:
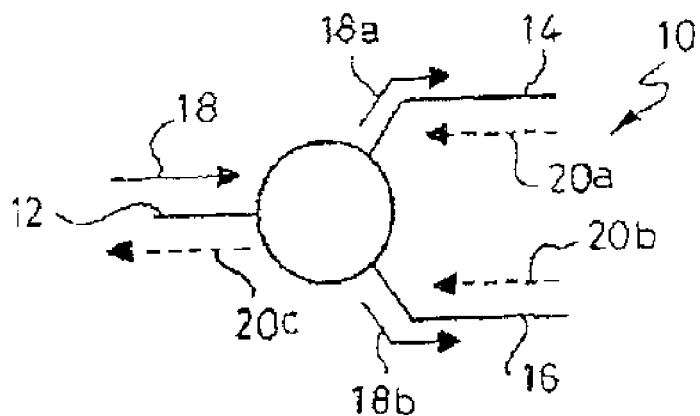
FIGS. 1 and 2 are schematic diagrams of prior art signal splitters/combiners.
Figure 2:
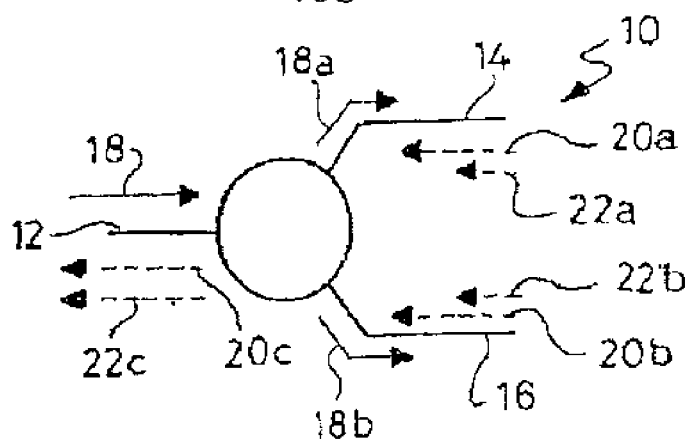

The prior art signal splitter/combiner 10 of FIGS. 1 and 2 comprises an input 12 and a large number of outputs, of which only a first output 14 and a second output 16 are shown for the purpose of clarity. In use these passive signal splitters/combiners 10 act as an interface between a local centre or node and a number of customers, each customer connected to one output of the splitter/combiner 10, with the splitter/combiner input 12 connected to the node. Arrow 18 represents transmission of television signals (downstream signals) from the service provider to the input of the splitter/combiner where the signal is divided or split for onward transmission to the customer, arrows 18*a* and 18*b* representing transmission of split television signals from the first and second outputs 14, 16 of the splitter/combiner 10.

Dotted arrows 20*a* and 20*b* represent the return transmission of data signals (upstream signals) from the first and second subscribers to the first and second outputs of the splitter/combiner.

The splitter/combiner combines the data signals from all subscribers to which it is connected and applies them to the input of the splitter/combiner. Dotted arrow 20*c* represents transmission of all combined data signals from the input of the splitter/combiner to the service provider.

Turning to FIG. 2, short dotted arrows 22*a* and 22*b* represent noise components present in the data signals transmitted from the subscribers to the first and second inputs of the splitter/combiner. The splitter/combiner 10 not only combines the wanted data signal but also combines the noise components and applies them to the input 12 of the splitter/combiner. Long dotted arrow 22*c* represents transmission of the combined noise signals from the input of the splitter/combiner to the service provider.

With a large number of outputs, the combined noise components applied to the input of the splitter/combiner (and hence transmitted from the input of the splitter/combiner to the service provider) become significant in comparison with the data signals, thus reducing the signal transmission capacity of the upstream channel between the splitter/combiner and the service provider. By way of example, suppose there are 1000 customers connected to a single local centre or optical node. If all customers produce the same amount of ingress then the total signal to noise ratio at the local centre or optical point will degrade with a factor 1000 or 30 dB.

Figure 3A:
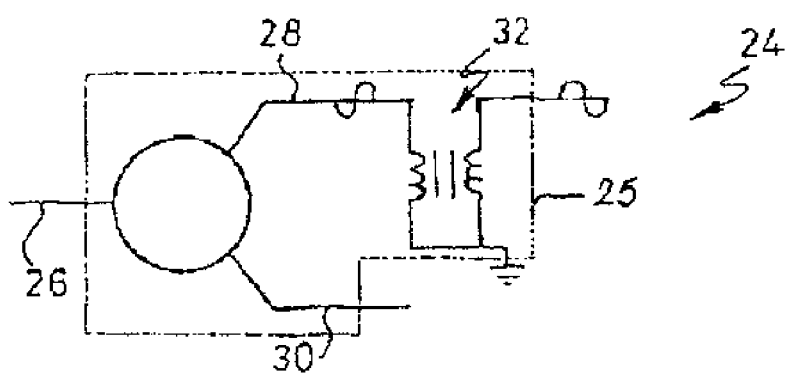
FIGS. 3a and 3b are schematic diagrams, respectively, of a signal splitter/combiner in accordance with the invention with a phase shifting device permanently connected to an output and secured within a common housing to the output, so being built into the splitter/combiner, and a signal splitter/combiner in accordance with the invention with a phase shifting device separable from an output.
Figure 3B:
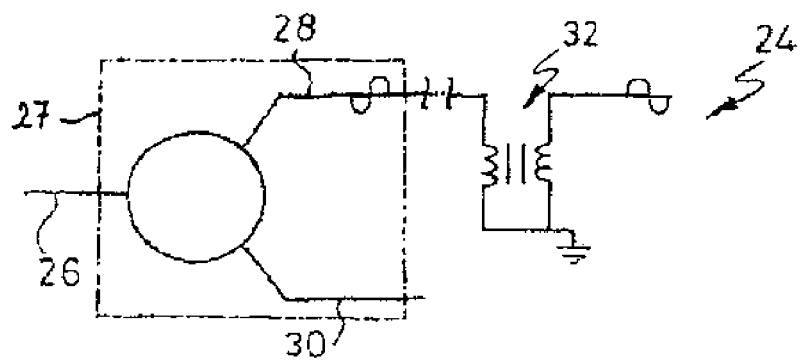

Splitters/combiners 24 in accordance with the present invention are shown in FIGS. 3*a* and 3*b* and comprise an input 26, a plurality of outputs of which only a first output 28 and a second output 30 are shown for clarity, and a plurality of phase shift transformers connected to alternate outputs, of which only transformer 32 connected to the first output 28 is shown. Each transformer is only connected to one output. The phase shift transformers can be built into the splitter/combiner and permanently associated with their respective outputs by means of a common housing 25, as shown in FIG. 3*a*. Alternatively the transformers can be removably connected externally of a housing 27 of the splitter/combiner to existing outputs, as shown in FIG. 3*b*.

The phase shift transformer 32 introduces a 180° phase shift into signals that pass through it. Thus split television signals applied to the first output 28 are shifted in phase by 180° before being transmitted to the subscriber, and data signals transmitted by a subscriber's equipment connected to the first output 28 are shifted in phase by 180° before being applied to the first output 28.

As explained above, the data signals transmitted by the subscribers to the outputs of the splitter/combiner include noise components. The noise components have various sources, the most significant of which is radio frequency electromagnetic radiation, which can be picked up by the subscribers' equipment and the cables connecting the outputs of the splitter/combiner to the equipment of the subscribers. In most cases, a source of radio frequency electromagnetic radiation that is picked up by one such cable or subscriber's equipment will be picked up by a large number of other such cables or subscribers' equipment.

The signal characteristics of the noise components will be very similar because they arise for the most part from the same source. The noise components will have much the same frequency, amplitude and phase. The phase shift transformers connected to alternate outputs of the splitter/combiner give rise to two groups of noise components. The noise components of both groups have much the same frequency and amplitude, but the noise components of the first group are in antiphase with the noise components of the second group. When the noise components of both groups are combined, they cancel each other out so that the noise components of the combined signals applied to the input of the splitter/combiner are much reduced.

The wanted data signals originating from the customer are unaffected as the data components from different customers are unrelated in amplitude, phase, and frequency as they originate from different subscriber equipment. They are therefore not reduced by combination after phase shifting. The downstream signal is also not affected by the phase shift, and thus by using a phase shifting transformer mounted between the splitter/combiner output and the connected branch of the network, wanted downstream and upstream signals are unaffected whilst ingress is attenuated.

Of course, there are some localised sources of radio frequency electromagnetic radiation that are picked up by only one subscriber's equipment or one cable, such as an electric motor in an appliance in a house of a subscriber. The introduction of the phase shift cannot reduce such a noise component. Many houses have connections to two outputs of the splitter/combiner, one connection being used for cable television and the other for telephone or internet service. Provided that one connection is to an output of the splitter/combiner with a phase shift transformer and the other connection is to an output without such a transformer, noise components due to even a localised source of radio frequency electromagnetic radiation can be reduced.

FIG. 4 shows the signal power at the input 12 of the prior art splitter/combiner 10 when used in a cable television network. The range of frequencies shown in the spectrum analyser trace is 0 to 70 MHz, which encompasses the frequency range used for the signal return path.

A peak of between 50 dB and 60 dB can be seen near to the middle of the trace i.e. at around 35 MHz. This is due to the summed noise components of the data signals transmitted to the splitter/combiner by the subscribers.

FIG. 5 shows the signal power at the input 26 of the splitter/combiner 24 of the invention when used in the same network. The signal power at around 35 MHz can be seen to be between 40 dB and 50 dB. The decrease of approximately 10 dB in the signal power at 35 MHz is due to the removal of 10 dB of the noise components by the splitter/combiner. In theory at least, this would result in an increase in the data transmission capacity of the channel between the input 26 and the service provider by a factor of 10.

The signal splitter/combiner of the invention is dependent for successful operation on similarity between the noise components of data signals applied to the outputs of the splitter/combiner. The reduction of the noise components in the combined data signals will be less pronounced if the noise components are of different amplitudes or experience different phase shifts during transmission from the subscribers' equipment to the outputs of the splitter/combiner. Nevertheless, a reduction of only 3 dB of the noise components can give rise to a doubling of the data transmission capacity of the upstream signal channel.

The reduction of the noise components is slightly less pronounced if the splitter/combiner has an odd number of outputs. In this case the number of phase shifters attached to the outputs should be as close as possible to half the number of outputs, for example two or three phase shifters for a splitter/combiner with five outputs. Of course, for a splitter/combiner with a larger odd number of outputs, the effect of having phase shifters attached to slightly less or more than half the outputs of the splitter/combiner decreases with increasing numbers of outputs.

The cable television network referred to above is shown in FIG. 6 and comprises a local centre or optical node 60 connected to an input of a first signal splitter/combiner 62. A first output of the first signal splitter/combiner 62 is connected to an input of a first phase shifting device 64.

An output of the first phase shifting device 64 is connected to an input of a second splitter/combiner 66. A second output of the first signal splitter/combiner 62 is connected to an input of a third signal splitter/combiner 68.

A first output of the second signal splitter/combiner 66 is connected to an input of a second phase shifting device 70. An output of the second phase shifting device 70 is connected to a first item of subscriber equipment 74. A second output of the second signal splitter/combiner 66 is connected to a second item of subscriber equipment 76.

A first output of the third signal splitter/combiner 68 is connected to an input of a third phase shifting device 72. An output of the third nhase shifting device 72 is connected to a third item of subscriber equipment 78. A second output of the third signal splitter/combiner 68 is connected to a fourth item of subscriber equipment 80.

The invention claimed is:

1. A signal splitter/combiner for use in a cable television network, the signal splitter/combiner comprising an input connectable to a local centre or optical node of a cable television network, and a plurality of outputs, each of the outputs being connectable to a different item of subscriber equipment, the signal splitter/combiner being operable to split downstream signals at the input for downstream transmission to the outputs and to combine upstream signals at the outputs for upstream transmission to the input, wherein alternate ones of the outputs are connected to phase shifting devices such that noise components of the upstream signals at least partially cancel one another when the upstream signals are combined by the signal splitter/combiner.

2. A signal splitter/combiner according to claim 1, wherein the phase shifting devices introduce a phase shift of 180°, so that noise components of alternate ones of the outputs are antiphase and cancel one another out almost entirely when the signals are combined.

3. A signal splitter/combiner according to claim 1, wherein each of said phase shifting devices comprises a phase shifting transformer.

4. A signal splitter/combiner according to claim 1, wherein the phase shifting devices are permanently connected to respective ones of said plurality of outputs and secured within a common housing to the outputs, so being built into the splitter/combiner.

5. A signal splitter/combiner according to claim 1, wherein the phase shifting devices are separable from respective ones of said plurality of outputs.

6. A cable television network incorporating a plurality of signal splitters/combiners, each signal splitter/combiner comprising an input and a plurality of outputs, wherein each of the outputs is connectable to a different item of subscriber equipment and alternate ones of the outputs are connected to phase shifting devices, the phase shifting devices acting in use to ensure that noise ingress in upstream signals, i.e. those originating from customers, passing into the network is substantially reduced.

* * * * *